(12) United States Patent
Alden, III et al.

(10) Patent No.: US 7,448,883 B2
(45) Date of Patent: Nov. 11, 2008

(54) CONNECTOR WITH METALIZED COATED POLYMER CONTACT

(75) Inventors: Wayne Stewart Alden, III, Whitman, MA (US); Jeffery W. Mason, N. Attleboro, MA (US); Peter Wapenski, Foster, RI (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/702,726

(22) Filed: Feb. 5, 2007

(65) Prior Publication Data

US 2008/0188127 A1 Aug. 7, 2008

(51) Int. Cl.
*H01R 9/09* (2006.01)
(52) U.S. Cl. .......................... 439/91; 439/931
(58) Field of Classification Search ............... 439/66, 439/91, 931
See application file for complete search history.

(56) References Cited

U.S. PATENT DOCUMENTS

| | | | | |
|---|---|---|---|---|
| 5,338,209 A | * | 8/1994 | Brooks et al. | 439/66 |
| 5,599,193 A | * | 2/1997 | Crotzer | 439/66 |
| 5,624,268 A | * | 4/1997 | Maeda et al. | 439/66 |
| 6,217,343 B1 | * | 4/2001 | Okuno | 439/67 |
| 6,271,482 B1 | | 8/2001 | Crotzer et al. | |
| 6,348,659 B1 | | 2/2002 | Crotzer et al. | |
| 6,790,057 B2 | | 9/2004 | DelPrete et al. | |
| 7,070,420 B1 | | 7/2006 | Wakefield et al. | |

* cited by examiner

*Primary Examiner*—Neil Abrams

(57) ABSTRACT

A socket connector includes an insulator having a plurality of apertures. A plurality of contacts are held by the insulator and arranged in groups. Each group includes plural contacts disposed around a periphery of a respective aperture. Each contact includes a polymer contact body having first and second opposite contact tips. A conductive coating extends on the contact body from the first contact tip to the second contact tip.

14 Claims, 3 Drawing Sheets

CONNECTOR WITH METALIZED COATED POLYMER CONTACT

BACKGROUND OF THE INVENTION

The invention relates generally to surface mounted connectors on printed circuit boards, and more specifically, to a contact for surface mounted connectors.

The ongoing trend toward smaller, lighter, and higher performance electrical components and higher density electrical circuits has led to the development of surface mount technology in the design of printed circuit boards. As is well understood in the art, surface mountable packaging allows for the connection of the package to pads on the surface of the circuit board rather than by contacts or pins soldered in plated holes going through the circuit board. Surface mount technology allows for an increased component density on a circuit board, thereby saving space on the circuit board.

The ball grid array (BGA) and land grid array (LGA) are two types of surface mount packages that have developed in response to the demand created by higher density electrical circuits for increased density of electrical connections on the circuit board. The ball grid array includes an array of connections on the bottom side of the connector package. In the ball grid array, pins extending into the circuit board are replaced by small solder balls placed on the bottom side of the connector at each contact location. The circuit board, rather than holes, has an array of contact pads matching the solder ball placements on the connector bottom. Connections are made by reflow soldering the solder balls to mechanically and electrically engage the connector to the circuit board. The land grid array is similar to the ball grid array except that, rather than the application of solder balls, the land grid array socket applies sufficient normal force on the package to mate the package on flexible contact beams in the connector.

BGA and LGA technology offer the advantages of higher connection densities on the circuit board and higher manufacturing yields which lower product cost. However, they are not without disadvantages. In particular, during the development of chips, chip sockets, multi-chip modules (MCM's), and other electronic packages using BGA technology, testing of product revisions requires soldering and unsoldering of the packages which, in the case of ball grid array devices, is particularly difficult.

In a prior art electrical interconnect system as disclosed in U.S. Pat. No. 7,070,420, an array of electrical contacts is held in a substrate. Each contact includes a nonconductive elastomeric element and an associated conductive element. The nonconductive element has opposite ends disposed beyond respective opposite sides of the substrate. The conductive element includes a body having opposite ends disposed exteriorly of respective opposite ends of the nonconductive elastomeric element. The opposite ends of the nonconductive elastomeric element resiliently press against the respective opposite ends of the conductive element when a force is applied to the electrical contact.

However, a need remains for a compressible contact system having smaller compressive contacts that can be more easily and economically molded. Further, the contact system should provide a sufficient working range and sufficient compressibility to allow multiple matings and unmatings of electronic packages without soldering and unsoldering of contact connections.

BRIEF DESCRIPTION OF THE INVENTION

In one aspect, a socket connector is provided. The socket connector includes an insulator having a plurality of apertures. A plurality of contacts are held by the insulator and arranged in groups. Each group includes plural contacts disposed around a periphery of a respective aperture. Each contact includes a polymer contact body having first and second opposite contact tips. A conductive coating extends on the contact body from the first contact tip to the second contact tip.

More specifically, the conductive coating extends along a portion of the contact body that extends into its respective aperture in the insulator. The conductive coating includes layers of copper, nickel and gold. The apertures in the insulator include primary apertures about which a plurality of positioning apertures are distributed to locate the contacts on the insulator. One of the contact tips is configured to electrically engage a contact pad on an electronic package and the other of the contact tips is configured to electrically engage a corresponding contact pad on a circuit board. The insulator is formed from a flexible polyimide material and the contacts are molded from a pure polymer.

In another aspect, a socket connector includes a dielectric housing and a contact field held within the housing. The contact field includes an insulator and a plurality of compressive polymer contacts. The plurality of contacts is arranged in groups of plural contacts disposed around the periphery of apertures in the insulator. Each contact includes an elongated contact body longitudinally extending between first and second opposite contact tips. A conductive coating is deposited on the contact tips and on selected areas of an outer surface of the contact body such that a conductive path from the first contact tip to the second contact tip is minimized.

In yet another aspect, a contact for a socket connector is provided that includes an elongated contact body formed from compressive polymer that longitudinally extends between first and second opposite contact tips. A conductive coating is deposited on the contact tips and on selected areas of an outer surface of the contact body to provide a direct conductive path from the first contact tip to the second contact tip.

DETAILED DESCRIPTION OF THE INVENTION

Figure 1:
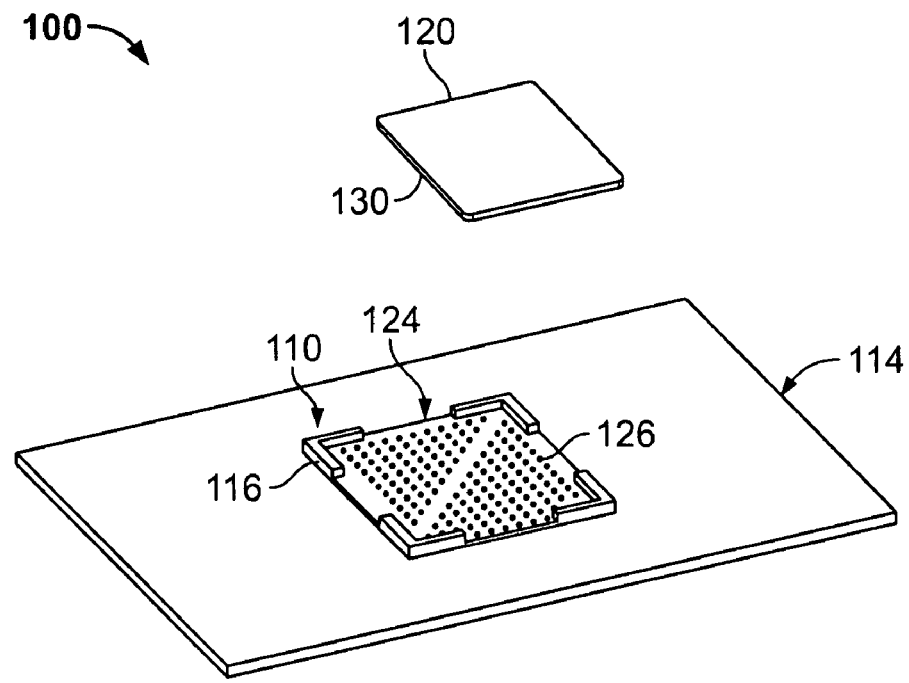
FIG. 1 is an exploded view of an electronic assembly including a socket connector formed in accordance with an exemplary embodiment of the present invention.

FIG. 1 illustrates an electronic assembly 100 including a socket connector 110 formed in accordance with an exemplary embodiment of the present invention. The socket connector 110 is mounted on a circuit board 114. An electronic package 120 is loaded onto the socket connector 110. When loaded onto the socket connector 110, the electronic package 120 is electrically connected to the circuit board 114. The electronic package may be a chip or module such as, but not limited to, a central processing unit (CPU), microprocessor, or an application specific integrated circuit (ASIC), or the like. While the invention will be described in terms of a land grid array (LGA) package, it is to be understood the inventive concepts described herein may be applied to other types of packages such as for evaluating ball grid array (BGA) devices prior to application of solder balls. The following description is for illustrative purposes only and no limitation is intended thereby.

The socket connector 110 includes a housing 116 that holds a contact field 124. A plurality of compressive polymer contacts 126 are arranged in and held in the contact field 124. The electronic package 120 has a mating surface 130 that engages the contact field 124. The mating surface 130 includes a plurality of contact pads (not shown in FIG. 1) that engage the contacts 126 to electrically connect the electronic package 120 to the circuit board 114 as will be described.

Figure 2:
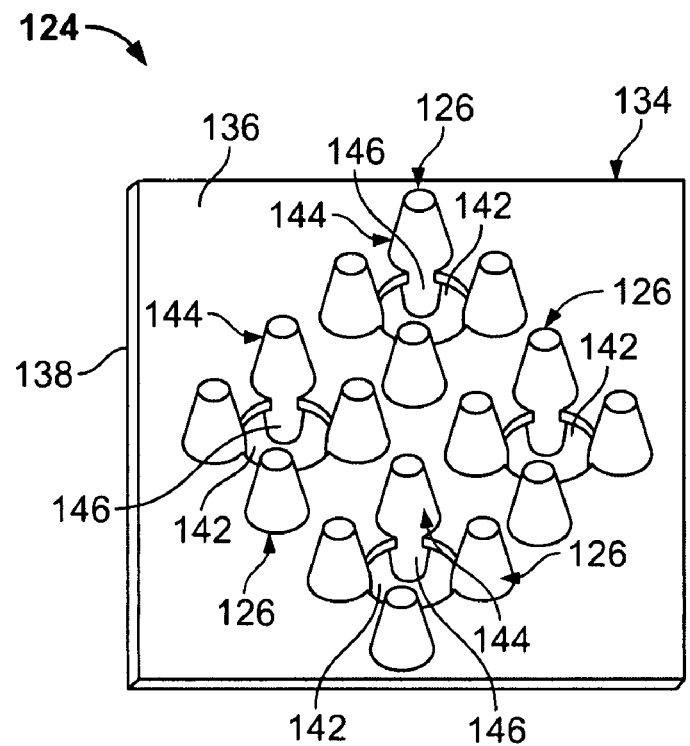
FIG. 2 is an enlarged view of a portion of a contact field formed in accordance with an exemplary embodiment of the present invention.
Figure 3:
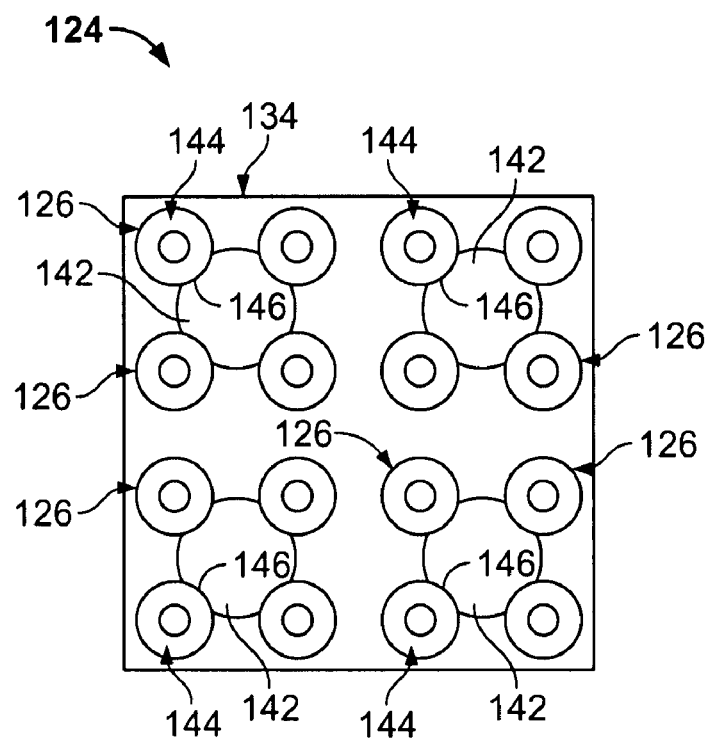
FIG. 3 is an enlarged top plan view of a portion of the contact field shown in FIG. 2.

FIG. 2 illustrates an enlarged view of a portion of a contact field 124 formed in accordance with an exemplary embodiment of the present invention. FIG. 3 illustrates an enlarged top plan view of a portion of the contact field 124. The contact field 124 includes an insulator 134 that holds the contacts 126. The insulator 134 includes an upper side 136 and an opposite lower side 138. In one embodiment, the insulator 134 may be formed such that the upper and lower sides 136 and 138 are substantially planar and parallel to one another. The contacts 126 are arranged in groups and disposed around the periphery of apertures 142 which may be referred to as primary apertures 142 in the insulator 134. In the illustrated embodiment, the contacts 126 are arranged in groups of four; however, it is to be understood that the contacts 126 may be arranged in groups of any number. In an exemplary embodiment, the insulator 134 is fabricated from a flexible polyimide material, and more specifically, the insulator 134 may be fabricated from a polyimide material that is commonly known as Kapton® which is available from E. I. du Pont de Nemours and Company. The contacts 126 have an outer surface 144, a portion 146 of which extends into the primary apertures 142.

Figure 4:
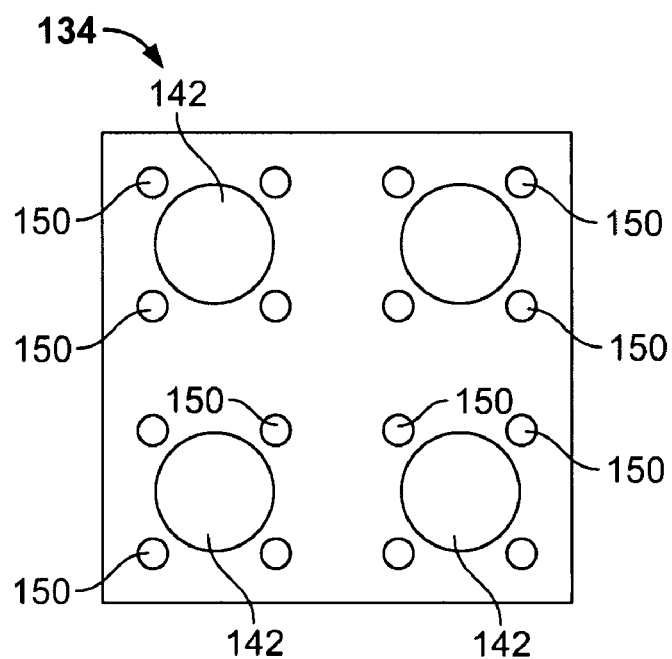
FIG. 4 is an enlarged top plan view of the insulator shown in FIG. 2.

FIG. 4 illustrates a top plan view of the insulator 134 with the contacts 126 removed. The insulator 134 is formed with a number of primary apertures 142 and a number of positioning apertures 150 distributed around the primary apertures 142. The contacts 126 (FIG. 2) are molded onto the insulator 134 and through the positioning apertures 150 to locate the contacts 126 on the insulator 134. In molding the contacts 126, the primary apertures 142 serve as a central polymer feed for the introduction of the contact polymer. This enables a molding machine to mold all of the polymer contacts 126 in the group of contacts simultaneously. The contacts 126 are positioned on the insulator 134 such that a portion 146 of the outer surface 144 (FIG. 2) of the contacts 126 extends into the primary apertures 142. One positioning aperture 150 is provided for each contact 126.

Figure 5:
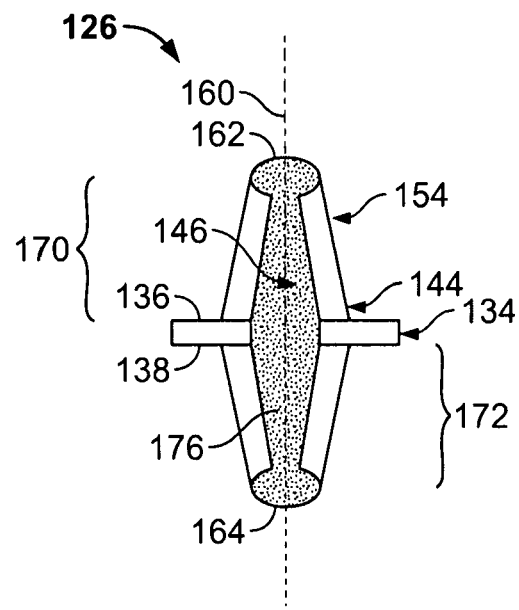
FIG. 5 is an enlarged front elevational view of a contact shown in FIG. 2.

FIG. 5 is an enlarged front elevational view of the compressive polymer contact 126. The contact 126 is shown attached to the insulator 134. In the exemplary embodiment, the contact 126 is formed from a pure polymer. In alternative embodiments, the contact 126 may be formed from a mix of two or more polymers and other additives selected to provide a desired set of mechanical properties such as, for instance, a desired force/deflection relationship. The contact 126 includes an elongated contact body 154 that extends along a longitudinal axis 160 between first and second opposite contact tips 162 and 164. The body 154 includes the outer surface 144 with the portion 146 that extends into the primary aperture 142 (FIGS. 2 and 3). The insulator 134 partially encompasses a central portion of the contact body 154 so that an upper portion 170 of the contact 126 is disposed above the upper side 136 of the insulator 134 and a similar lower portion 172 is disposed below the lower side 138 of the insulator 134. A conductive coating 176 is deposited on the contact tips 162 and 164 and on selected areas of the outer surface 144 of the contact body 154 including the portion 146 to provide a direct conductive path along the contact body 154 from the first contact tip 162 to the second contact tip 164 that extends through the primary aperture 142. In this manner, a minimized signal path is provided between the contact tips 162 and 164. Each of the contacts 126 around the periphery of the primary aperture 142 has a separate conductive path that extends through the same primary aperture 142.

In the exemplary embodiment, the conductive coating 176 is comprised of layers of copper, nickel and gold that are applied using known particle vapor deposition processes. Equipment for using one such process is available from Tanury Industries of Lincoln, R.I. In the exemplary embodiment, copper is first deposited on the polymer contact 126 and is applied as a base for a nickel layer which provides a corrosion barrier. An outer layer of gold is deposited for enhanced conductivity. The contact 126 is masked during the coating processes so that the conductive coating 176 is applied to selected areas of the outer surface 144 of the contact body 154. The coating 176 can flex with the contact 126 as the contact 126 is compressed and released.

Figure 6:
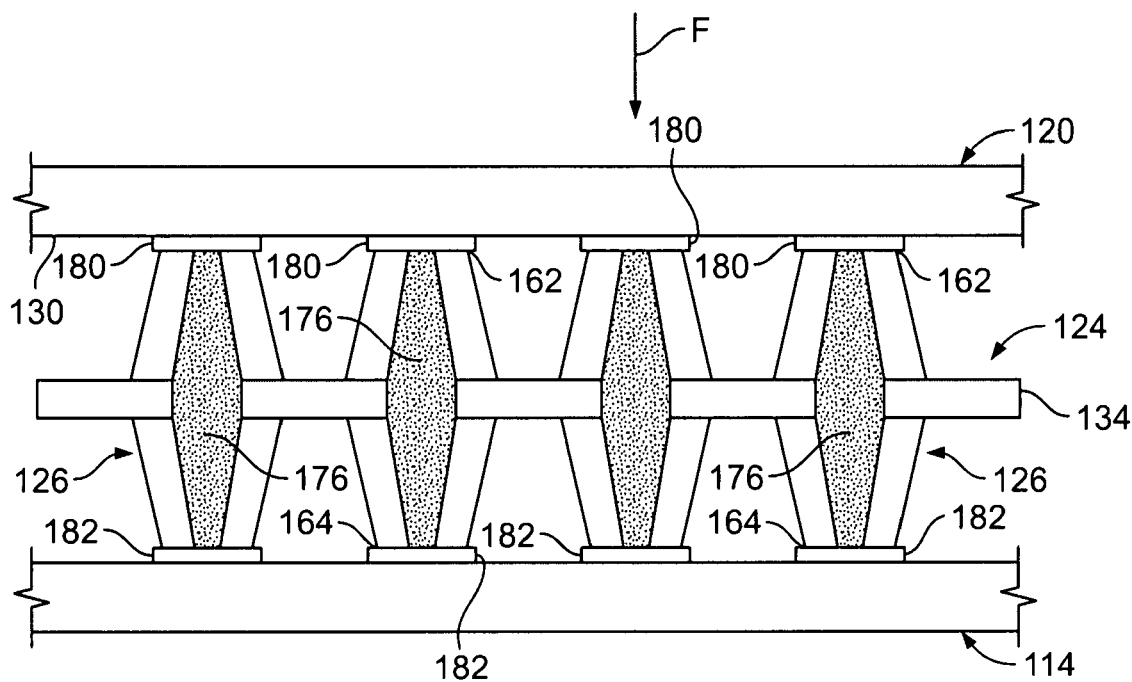
FIG. 6 is an enlarged front elevational view of a portion of a contact field interposed between a circuit board and an electronic package.

FIG. 6 is an enlarged elevational view of a portion of the contact field 124 interposed between the circuit board 114 and the electronic package 120. The mating surface 130 of the electronic package 120 includes a plurality of contact pads 180. The circuit board 114 also includes a plurality of surface contact pads 182. When the contact field 124 is interposed between the electronic package 120 and the circuit board 114, such as when the electronic package 120 is loaded onto the socket connector 110 (FIG. 1), one of the contact tips 162 electrically engages one of the contact pads 180 on the electronic package 120 and the opposite contact tip 164 electrically engages a corresponding contact pad 182 on the circuit board 114. In the exemplary embodiment, the socket connector includes a mechanism (not shown) that is configured to apply a mating load (F) on the electronic package 120 to compress the contacts 126 to assure adequate engagement of the contact tips 162, 164 with the contact pads 180 on the electronic package 120 and the contact pads on the circuit board 114.

The embodiments thus described provide a connector having compressible contacts that allow multiple matings and unmatings of devices such as land grid array packages, or ball grid array devices prior to the application of the solder balls, without soldering and unsoldering the package to and from a circuit board. The contacts include a conductive coating deposited on selected areas of the contacts. The conductive coating can flex as the contact is compressed and released. The connector is particularly useful during package development where multiple revisions of the package can be mounted and tested without soldering. In a production environment, the contacts can be more economically molded with a higher contact density than traditional stamped and formed metal contacts and have an improved working range such that the requirements for flatness the packages may be relaxed sufficiently to increase package manufacturing yields.

While the invention has been described in terms of various specific embodiments, those skilled in the art will recognize that the invention can be practiced with modification within the spirit and scope of the claims.

What is claimed is:

1. A socket connector comprising:
an insulator having a plurality of apertures, a plurality of contacts held by said insulator and arranged in groups wherein each said group includes plural said contacts disposed around a periphery of a respective aperture, each said contact including a polymer contact body having first and second opposite contact tips, and a conductive coating extending on said contact body from said first contact tip to said second contact tip, wherein a portion of each said contact body extends into said respective aperture.

2. The socket connector of claim 1, wherein one of said contact tips is configured to electrically engage a contact pad on an electronic package and the other of said contact tips is configured to electrically engage a corresponding contact pad on a circuit board.

3. The socket connector of claim 1, wherein said apertures in said insulator comprise primary apertures about which a plurality of positioning apertures are distributed to locate said contacts on said insulator.

4. The socket connector of claim 1, wherein said conductive coating comprises layers of copper, nickel and gold.

5. The socket connector of claim 1, wherein said insulator partially encompasses a central portion of said contact body.

6. The socket connector of claim 1, wherein said insulator comprises a flexible polyimide material.

7. The socket connector of claim 1, wherein said polymer comprises a pure polymer.

8. A socket connector comprising:
an insulator having a plurality of apertures, a plurality of contacts held by said insulator and arranged in groups wherein each said group includes plural said contacts disposed around a periphery of a respective said aperture, each said contact including a polymer contact body having first and second opposite contact tips, and a conductive coating extending on said contact body from said first contact tip to said second contact tip, wherein a portion of said contact body extends into its respective said aperture and said conductive coating extends along said portion of each said contact body.

9. A socket connector comprising:
a dielectric housing; and
a contact field held within said housing, said contact field comprising an insulator and a plurality of compressive polymer contacts, wherein said plurality of contacts are arranged in groups of plural contacts disposed around the periphery of apertures in said insulator, and wherein each said contact includes an elongated contact body longitudinally extending between first and second opposite contact tips and a conductive coating deposited on said contact tips and on selected areas of an outer surface of said contact body such that a conductive path from said first contact tip to said second contact tip is formed, wherein said conductive coating is deposited on an area of the outer surface of each said contact body that extends into a respective said aperture in said insulator.

10. The socket connector of claim 9, wherein one of said contact tips is configured to electrically engage a contact pad on an electronic package and the other of said contact tips is configured to electrically engage a corresponding contact pad on a circuit board.

11. The socket connector of claim 9, wherein said apertures in said insulator comprise primary apertures about which a plurality of positioning apertures are distributed to locate said contacts on said insulator.

12. The socket connector of claim 9, wherein said conductive coating comprises layers of copper, nickel and gold.

13. The socket connector of claim 9, wherein said insulator partially encompasses a central portion of said contact body.

14. The socket connector of claim 9, wherein said polymer comprises a pure polymer.

\* \* \* \* \*